United States Patent
Cram

(10) Patent No.: US 6,756,802 B2
(45) Date of Patent: Jun. 29, 2004

(54) TEST SYSTEM FOR ELECTRONIC MODULES HAVING CONTACTORS WITH SPRING SEGMENT TERMINAL PORTIONS

(75) Inventor: Daniel P. Cram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/304,519

(22) Filed: Nov. 26, 2002

(65) Prior Publication Data

US 2003/0071642 A1 Apr. 17, 2003

Related U.S. Application Data

(63) Continuation of application No. 09/653,148, filed on Aug. 31, 2000, now Pat. No. 6,489,794.

(51) Int. Cl.[7] .......................... G01R 1/073; G01R 31/02
(52) U.S. Cl. ..................... 324/762; 324/158.1; 324/755
(58) Field of Search ................................. 324/754, 755, 324/757, 762, 765, 158.1; 439/266, 267, 268, 269, 270, 342

(56) References Cited

U.S. PATENT DOCUMENTS

| | | | |
|---|---|---|---|
| 434,151 A | | 8/1890 | Lange et al. |
| 500,918 A | | 7/1893 | Linton |
| 3,274,534 A | * | 9/1966 | Shortridge .................. 439/700 |
| 4,068,170 A | | 1/1978 | Chayka et al. |
| 4,237,602 A | | 12/1980 | Pomella et al. |
| 4,355,856 A | | 10/1982 | Porter |
| 4,574,235 A | | 3/1986 | Kelly et al. |
| 4,591,219 A | * | 5/1986 | Reimer ........................ 439/81 |
| 5,176,542 A | | 1/1993 | Grappe |
| 5,208,529 A | | 5/1993 | Tsurishima et al. |
| 5,227,717 A | | 7/1993 | Tsurishima et al. |
| 5,302,891 A | * | 4/1994 | Wood et al. ................ 324/765 |
| 5,360,348 A | | 11/1994 | Johnson |
| 5,440,240 A | | 8/1995 | Wood et al. |
| 5,625,297 A | | 4/1997 | Arnaudov et al. |
| 5,655,927 A | | 8/1997 | Maue et al. |
| 5,667,077 A | * | 9/1997 | Goins, III .................... 209/573 |
| 5,754,057 A | | 5/1998 | Hama et al. |
| 5,818,219 A | | 10/1998 | Hama et al. |
| 5,823,823 A | * | 10/1998 | Longueville et al. ........ 439/571 |
| 5,865,319 A | | 2/1999 | Okuda et al. |
| 5,941,740 A | | 8/1999 | Neuer et al. |
| 5,954,205 A | * | 9/1999 | Smith ............................. 209/2 |
| 5,973,394 A | | 10/1999 | Slocum et al. |
| 5,990,693 A | | 11/1999 | Hayes et al. |
| 6,045,370 A | | 4/2000 | Treibergs et al. |

(List continued on next page.)

*Primary Examiner*—Ernest Karlsen
(74) *Attorney, Agent, or Firm*—Stephen A. Gratton

(57) ABSTRACT

A pass through test system for testing an electronic module includes an interface board, and metal fret test contactors configured to electrically engage terminal contacts on the module. The test contactors and interface board are mounted to an automated or manual pass through test handler configured to allow electrical engagement of the module with a zero insertion force. The interface board includes interface contacts configured to engage the test contactors at intermediate points along their lengths, and to shorten the electrical paths through the test contactors. The interface contacts are in electrical communication with high speed conductors on the interface board, and can be constructed of a conductive polymer material, or alternately as metal frets. During a test method the module is supported edge to edge and generally parallel to the interface board. In an alternate embodiment the test contactors are metal frets configured to simultaneously electrically engage the terminal contacts on the module and planar interface contacts on the interface board. The test method includes the steps of: providing the movable test contactors, electrically engaging the terminal contacts on the module and the interface contacts on the interface board using the test contactors, and then applying test signals through the test contactors and the terminal contacts to the modules.

24 Claims, 5 Drawing Sheets

U.S. PATENT DOCUMENTS

| | | |
|---|---|---|
| 6,060,893 A | 5/2000 | Farnworth et al. |
| 6,064,218 A | 5/2000 | Godfrey et al. |
| 6,091,062 A | 7/2000 | Pfahnl et al. |
| 6,097,201 A | 8/2000 | Slocum |
| 6,133,745 A * | 10/2000 | Yoon et al. .................. 324/755 |
| 6,259,036 B1 | 7/2001 | Farnworth |
| 6,329,829 B1 | 12/2001 | Farnworth et al. |
| 6,333,555 B1 | 12/2001 | Farnworth et al. |
| 6,447,317 B1 * | 9/2002 | Billman ...................... 439/260 |
| 6,462,568 B1 | 10/2002 | Cram |
| 6,483,329 B1 | 11/2002 | Cram |
| 6,489,794 B1 | 12/2002 | Cram |
| 6,529,026 B1 | 3/2003 | Farnworth et al. |

\* cited by examiner

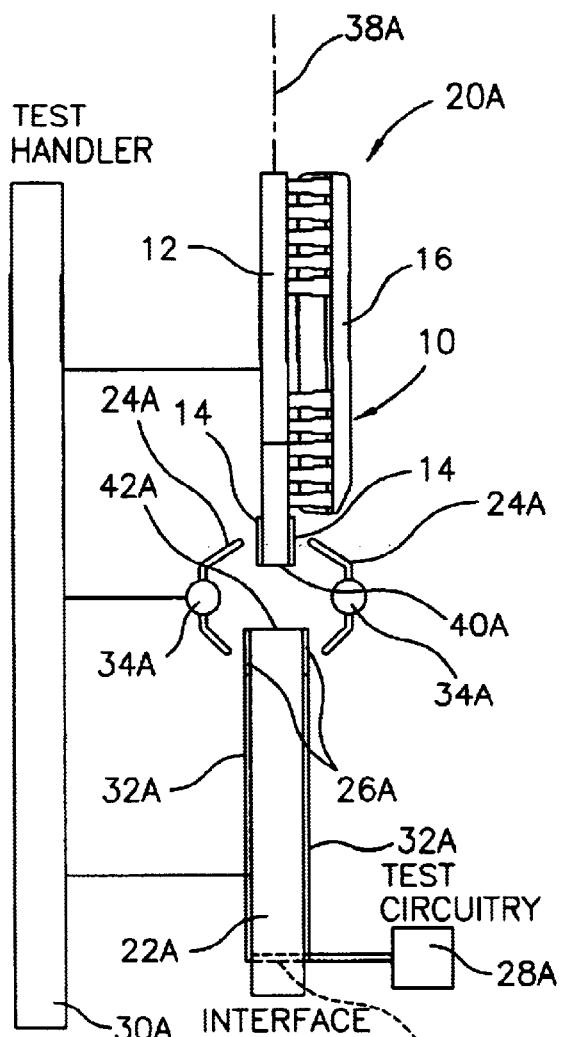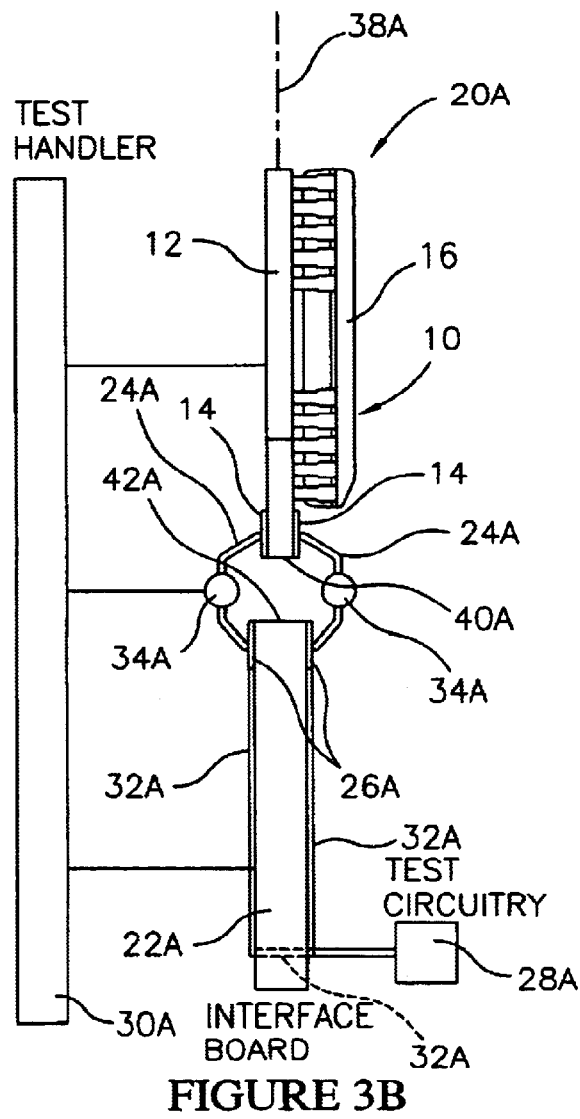
FIGURE 3A
FIGURE 3B

TEST SYSTEM FOR ELECTRONIC MODULES HAVING CONTACTORS WITH SPRING SEGMENT TERMINAL PORTIONS

CROSS REFERENCE TO RELATED APPLICATIONS

This application is a continuation of Ser. No. 09/653,148, filed on Aug. 31, 2000, U.S. Pat. No. 6,489,794.

FIELD OF THE INVENTION

This invention relates generally to the testing of electronic modules, and more particularly to a high speed pass through test system and test method for testing electronic modules.

BACKGROUND OF THE INVENTION

Electronic modules, such as semiconductor memory modules, multi chip modules, semiconductor carriers, semiconductor packages, and microprocessors are routinely tested during manufacture. The modules include terminal contacts in electrical communication with the electronic devices contained on the modules. For performing various test procedures on the modules, temporary electrical connections are made to the terminal contacts.

One type of prior art electronic module 10, which is illustrated in FIGS. 1A and 1B, includes a substrate 12, and multiple semiconductor packages 16 mounted to the substrate 12. The module 10 also includes a row of terminal contacts 14 on the substrate 12 in electrical communication with the integrated circuits contained on the semiconductor packages 16. The terminal contacts 14 comprise generally planar, in-line metal pads located on opposing sides of the substrate 12 along a lateral edge 18 thereof. The substrate 12 typically comprises an electrically insulating material such as a glass filled plastic (FR-4), or a ceramic. In addition, the substrate 12 includes through openings 19 which facilitate indexing and handling by automated test equipment and carriers.

For testing the electronic module 10, test systems have been developed and are commercially available from various manufacturers. These test systems are configured to make temporary electrical connections with the terminal contacts 14 on the module 10. In addition, the test systems are configured to apply test signals through the terminal contacts 14 to the electronic devices on the module 10, and then to analyze the response signals from the electronic devices. Often times these test systems merely test the gross functionality of the module 10, as the semiconductor packages 16 on the module 10 have been previously individually tested and burned-in.

The test systems typically include test boards and test circuitry in electrical communication with the test boards. In addition, the test boards typically include interface boards having test contactors configured to physically and electrically engage the terminal contacts 14 on either side of the module 10. In general, there are two types of test systems, which are sometimes referred to as "pass through test systems", or "socket test systems".

FIG. 1C illustrates a pass through test system 11PT having an interface board 13PT, and test contactors 15PT on the interface board 13PT. The test contactors 15PT are in electrical communication with test circuitry (not shown). In addition, the test contactors 15PT are movable from an inactive (open) position in which the terminal contacts 14 on the module 10 are not engaged, to an active (closed) position in which the terminal contacts 14 on the module 10 are physically and electrically engaged.

As shown in FIG. 1C, with the test contactors 15PT in an inactive (open) position, the module 10 can be indexed into a contactor area between the test contactors 15PT, as indicated by arrow 17PT. With the module 10 located in the contactor area, the test contactors 15PT can be mechanically moved to the active (closed) position to physically and electrically engage the terminal contacts 14. The pass through test contactors 15PT are sometimes referred to as being "zero insertion force" (ZIF) contactors because temporary electrical connections can be made without an insertion force being placed on the module 10.

FIG. 1D illustrates a socket test system 11S having an interface board 13S, and test contactors 15S on the interface board 13S. In this case, the test contactors 15S are normally in an active (closed) position, but are mechanically moved to an inactive (open) position as the module 10 is inserted from above, as indicated by arrow 17S. When the module 10 is in place, the test contactors 15S move back to the active (closed) position to physically and electrically engage the terminal contacts 10. The socket test contactors 15S are sometimes referred to as being "low insertion force" (LIF) contactors because an insertion force is exerted on the module 10 in making the temporary electrical connections with the test contactors 15S.

One advantage of the pass through test system 11PT (FIG. 1C) over the socket test system 11S, is that no insertion forces are exerted on the module 10 to provide electrical engagement for testing. Accordingly, less physical stress is placed on the module 10 during testing with the pass through test system 11PT. Also, as the number of terminal contacts 14 on the module 10 increases, the insertion forces exerted by the socket test system 11S increase. The socket test system 11S can therefore damage the module 10, or the terminal contacts 14 on the module 10, and can be more expensive to operate and maintain.

The present invention is directed to an improved pass through test system. In pass through test systems it is desirable to make temporary electrical connections with the terminal contacts 14 on the modules 10 that are reliable, and have low electrical resistance. This requires that the terminal contacts 14 be scrubbed, or alternately penetrated by the test contactors 15PT, such that oxide layers and surface contaminants on the terminal contacts 14 do not adversely affect the temporary electrical connections. However, in scrubbing or penetrating the terminal contacts 14, damage to the terminal contacts 14 and modules 10 must be minimized.

It is also advantageous in pass through test systems for the temporary electrical connections to provide electrical paths that are short in length to facilitate the application of high speed test signals, and to prevent capacitive coupling and the introduction of noise and spurious signals. Further, it is advantageous to make, and then break, the temporary electrical connections as quickly as possible, to facilitate a high throughput for the test procedure.

The pass through test system of the invention includes test contactors configured to make temporary electrical connections that are reliable, have low electrical resistance, and minimally damage terminal contacts on the modules. In addition, the test contactors are relatively inexpensive to make, provide a high throughput, and can be operated in a production environment with minimal maintenance.

SUMMARY OF THE INVENTION

In accordance with the present invention, a pass through test system and test method for testing electronic modules are provided. In illustrative embodiments, the test system is configured for testing electronic modules having planar, in-line terminal contacts substantially as previously described.

The test system includes test circuitry configured to generate test signals, and an interface board having interface contacts, and high speed conductors, in electrical communication with the test circuitry. The interface board can be mounted to an automated or manual test handler configured to transport, align, and hold the module on edge, generally parallel to the interface board.

The test system also includes test contactors configured to engage the terminal contacts on the component, and to simultaneously engage the interface contacts on the interface board. In illustrative embodiments, the test contactors comprise fret contacts configured to engage the terminal contacts with a zero insertion force (ZIF) on the module. An actuator mechanism moves the test contactors from an inactive (open) position wherein neither the terminal contacts on the module, nor the interface contacts on the interface board are engaged, to an active (closed) position wherein both the terminal contacts and the interface contacts are electrically engaged.

During electrical engagement of the terminal contacts, the interface contacts electrically engage the test contacts at an intermediate point along a length thereof, such that the electrical paths through the test contactors to the high speed conductors on the interface board are shortened. The interface contacts can comprise conductive polymer bumps, or alternately fret-type contacts. In addition, the high speed conductors on the interface board can have a multi level, or interleaved configuration to provide an increased density and impedance adjustment.

The test method includes the steps of: providing an interface board comprising a plurality of interface contacts and high speed conductors in electrical communication with test circuitry; providing a plurality of movable test contactors comprising fret contacts configured to electrically engage the terminal contacts and the interface contacts with a zero insertion force on the module; placing the module edge to edge and generally parallel to the interface board; moving the test contactors to electrically engage the terminal contacts on the module and the interface contacts on the interface board; and then applying test signals through the interface contacts, the test contactors and the terminal contacts to the module.

BRIEF DESCRIPTION OF THE DRAWINGS

FIG. 3A is a schematic side elevation view of an alternate embodiment test system constructed in accordance with the invention illustrating test contactors prior to electrical engagement of terminal contacts on a module under test; and FIG. 3B is a schematic side elevation view of the test system of FIG. 3A illustrating the test contactors during electrical engagement of the terminal contacts on the module under test.

DETAILED DESCRIPTION OF THE PREFERRED EMBODIMENTS

As used herein, the term "pass through test system" means a test system in which temporary electrical connections are made with the terminal contacts 14 on the module 10 with a "zero insertion force". As used herein, the term "zero insertion force" means that no forces are being exerted on the module 10 to move the test contactors 24 in making the temporary electrical connections.

Figure 1A:
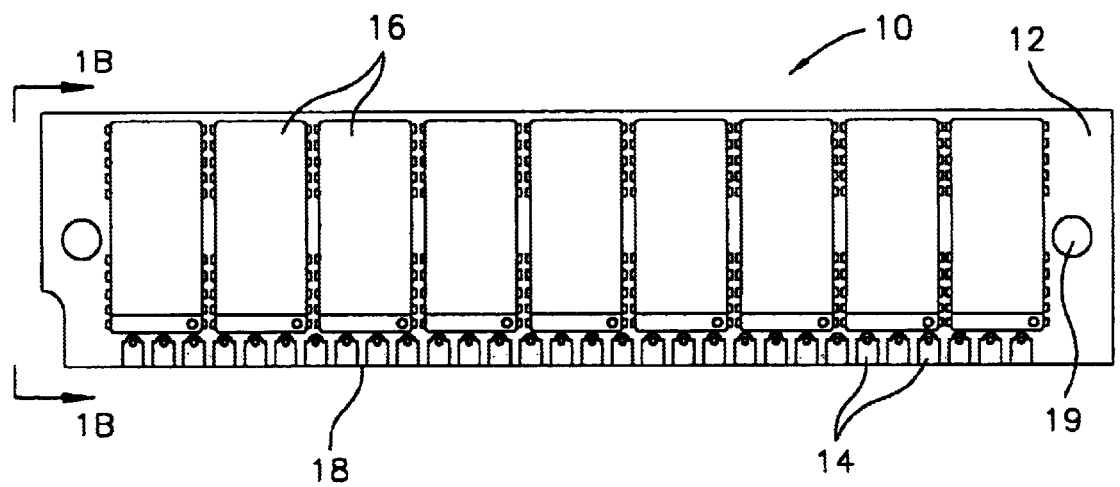
FIG. 1A is a plan view of a prior art electronic module.
Figure 1B:
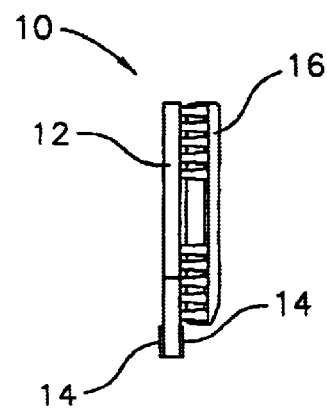
FIG. 1B is a side elevation view of FIG. 1A.
Figure 1C:
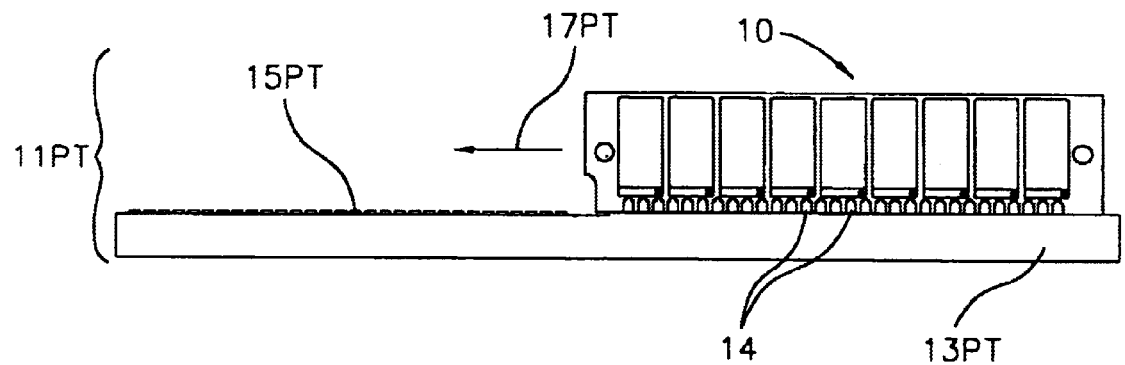
FIG. 1C is a schematic side elevation view of a prior art pass through test system.
Figure 1D:
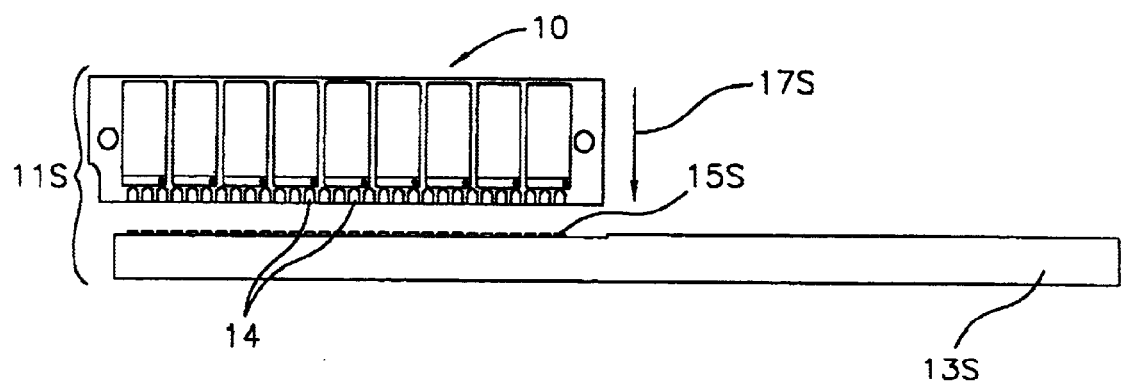
FIG. 1D is a schematic side elevation view of a prior art socket test system.
Figure 2A:
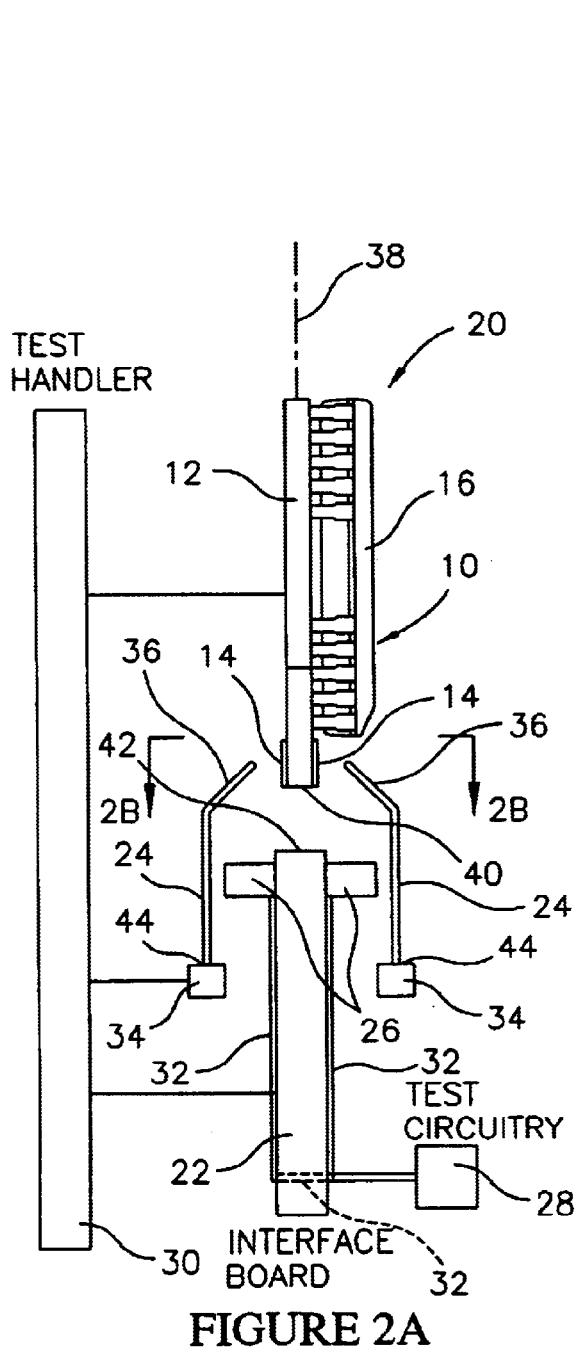
FIG. 2A is a schematic side elevation view of a test system constructed in accordance with the invention illustrating test contactors of the system prior to electrical engagement of terminal contacts on a module under test.
Figure 2B:
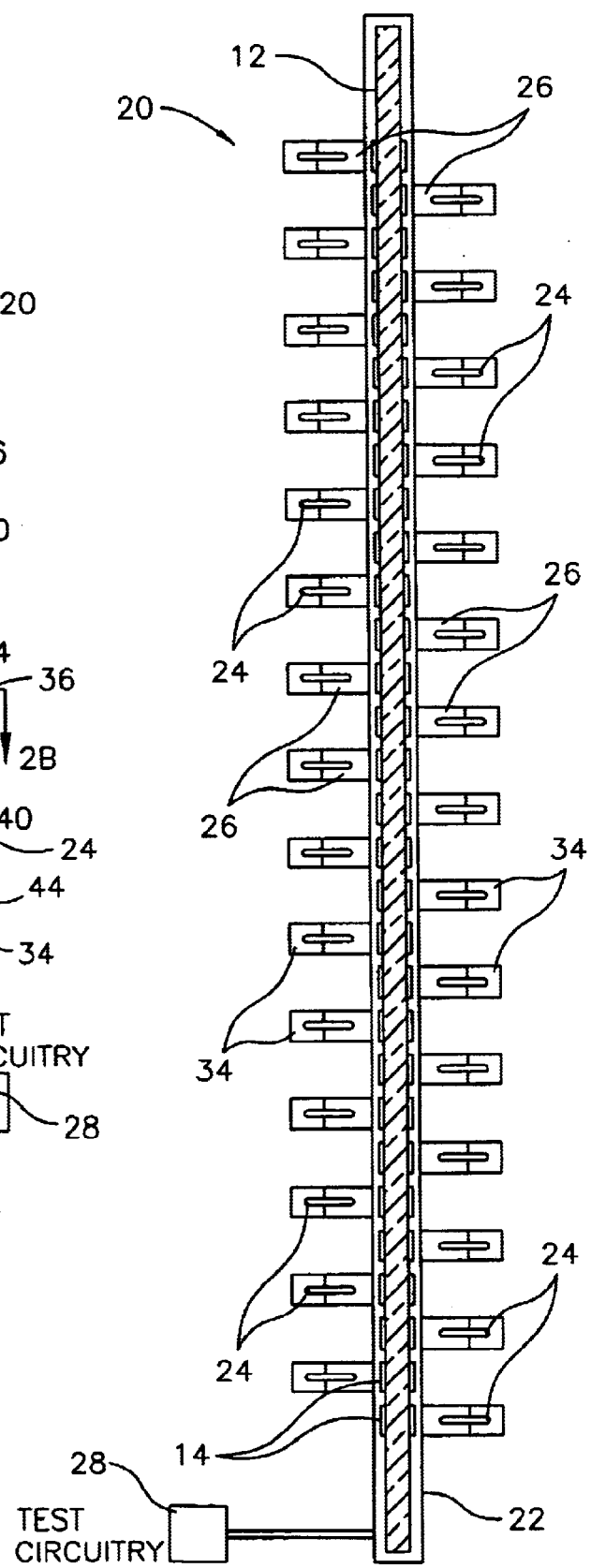
FIG. 2B is a schematic cross sectional view of the test system of FIG. 2A taken along line 2B—2B of FIG. 2A.
Figure 2C:
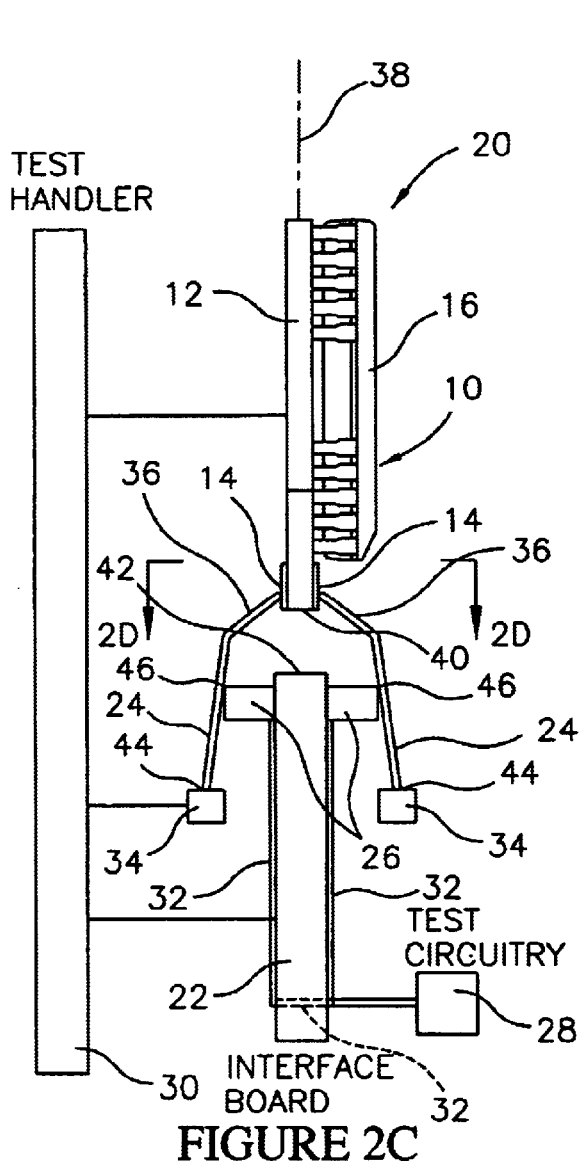
FIG. 2C is a schematic side elevation view of the test system of FIG. 2A illustrating the test contactors during electrical engagement of the terminal contacts on the module under test.
Figure 2E:
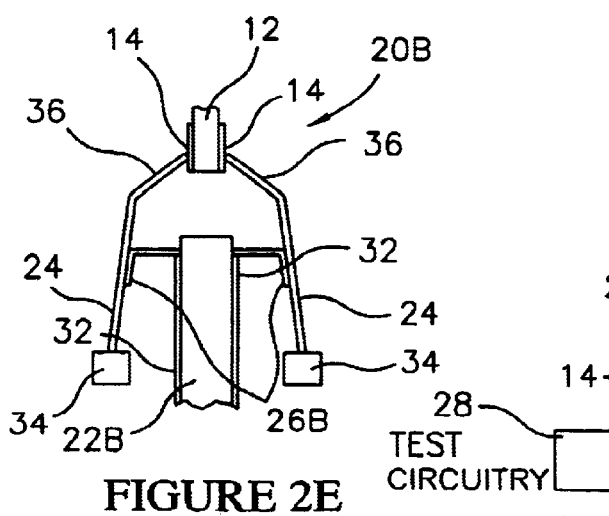
FIG. 2E is a partial side elevation view equivalent to FIG. 2C of an alternate embodiment test system having fret-type interface contacts.
Figure 2D:
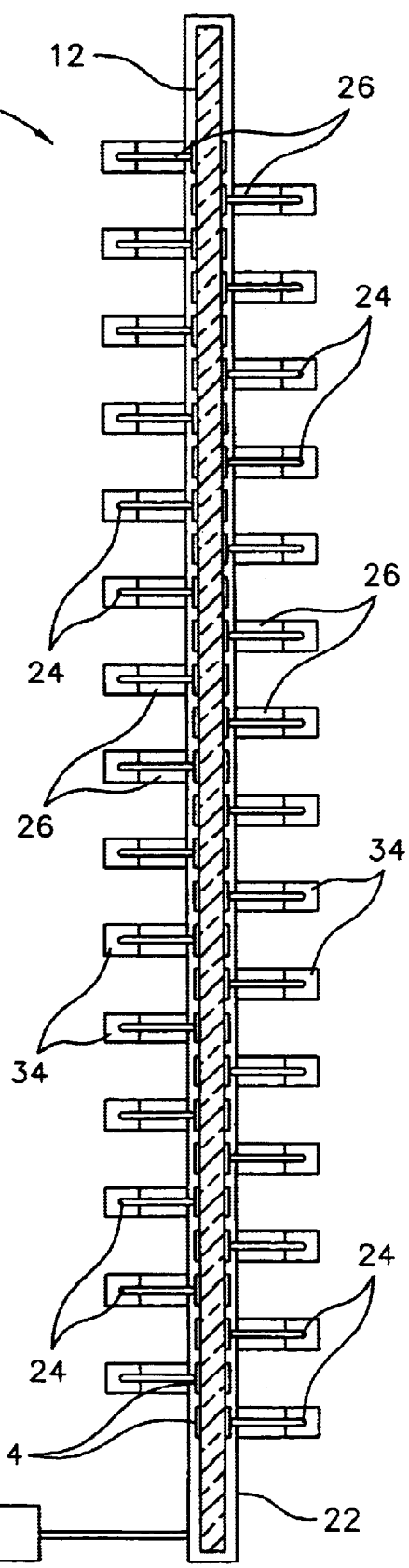
FIG. 2D is a schematic cross sectional view of the test system of FIG. 2A taken along line 2D—2D of FIG. 2C.

Referring to FIGS. 2A–2D, a pass through test system 20 constructed in accordance with a first embodiment of the invention, and configured to test electronic modules 10, is illustrated. The test system 20 includes a plurality of test contactors 24 configured to make temporary electrical connections with the terminal contacts 14 on the module 10. In FIGS. 2A and 2B, the test contactors 24 are shown in an inactive (open) position wherein the terminal contacts 14 are not engaged. In FIGS. 2C and 2D, the test contactors 24 are shown in an active (closed) position wherein the terminal contacts 14 are electrically engaged.

The test contactors 24 can have a conventional fret-type configuration, and can comprise a conventional low electrical resistivity material such as copper or a copper alloy such as beryllium copper. The test contactors 24 can be etched, stamped, machined, or otherwise shaped in a desired configuration. In the illustrative embodiments, the test contactors 24 include angled tip portions 36 configured to penetrate and exert spring forces on the terminal contacts 14.

In addition to the test contactors 24, the test system 20 also includes an interface board 22, and interface contacts 26 on the interface board 22. The interface contacts 26 are configured to electrically engage the test contactors 24 at some intermediate point along their length, and to shorten the electrical paths from the terminal contacts 14 through the test contactors 24. The test system 20 also includes test circuitry 28 configured to generate and apply high speed test signals through the interface contacts 26 and the test contactors 24, to the integrated circuits contained on the semiconductor modules 10, and to analyze the resultant signals.

The test contactors 24 and the interface board 22 are configured for mounting to an automated or manual pass through test handler 30. The test handler 30 is represented schematically by the block in FIGS. 2A and 2C. Support, movement and indexing of the module 10 can be provided by the test handler 30. In addition, support of the interface board 22 and the test contactors 24 can be provided by the test handler 30. Suitable automated pass through test handlers are commercially available from Advantest Corporation, Tokyo, Japan, and Kinetrix, Inc. Bedford, N.H., as well as other manufacturers.

Actuator mechanisms 34 on the test handler 30, such as cylinders, cams or motors, produce and control movement of the test contactors 24. Terminal ends 44 (FIG. 2A) of the test contactors 24 are in physical contact with the actuator mechanisms 34. However, the terminal ends 44 perform no electrical function, as the electrical paths through the test contactors 24 are from the tip portions 36 thereof, through intermediate portions 46 (FIG. 2C) in physical and electrical contact with the interface contacts 26.

The interface board 22 comprises an electrically insulating material, such as molded plastic, a glass filled resin (e.g., FR-4) or a ceramic. In addition to the interface contacts 24, the interface board 22 also includes high speed conductors 32 in electrical communication with the interface contacts 24 and with the test circuitry 28. The high speed conductors 32 are configured to transmit the high speed test signals without generating parasitic inductance, capacitive coupling and cross talk.

The high speed conductors 32 can comprise conventional low resistance conductive traces in a deposited configuration. For example, the high speed conductors 32 can comprise metal traces formed by an additive process (e.g., deposition through a mask onto the interface board 22) or a subtractive process (e.g., blanket deposition of a metal layer on the interface board 22 and etching).

As another alternative, the high speed conductors 32 can have a laminated construction, such as metal traces on a polymer film (e.g., TAB tape). With a laminated construction, the high speed conductors 32 can also have an interleaved, or strip line configuration, with some of the electrical paths, such as ground paths, contained on parallel planes. Such an interleaved configuration would permit an impedance of the high speed conductors 32 to be adjusted as required.

In the illustrative embodiment, the interface contacts 26 comprise conductive polymer bumps having a desired size and shape. In addition, the interface contacts 26 are illustrated as being generally square shaped bumps. However, this shape is merely illustrative, and other shapes such as domed, hemispherical, conical, pyramidal can also be used. Further, the interface contacts 26 can include angled surfaces configured to provide engagement surfaces that match the angle of the test contactors 24 in the active (closed) position. Alternately, the interface contacts 26 can include grooves, or slits, configured to retain the test contactors 24 in the active (closed) position. The interface contacts 26 can be deposited directly on terminal portions of the high speed conductors 32 using a suitable deposition process such as screen printing or stenciling. Preferably a pattern of the interface contacts 26, and the terminal portions of the high speed conductors 32 exactly matches a pattern of the test contactors 24.

A conductive polymer material for forming the interface contacts 26 can include an elastomeric matrix material having conductive particles embedded therein. Further, the conductive particles can be configured to provide an isotropic (or alternately anisotropic) electrically conductive path between the test contactors 24 and the high speed conductors 32. Besides providing conductive paths, the conductive particles can also function to penetrate into the test contactors 24, such that low resistance electrical connections are made.

Suitable elastomeric matrix materials for the conductive polymer material include epoxy, silicone, natural rubber, synthetic rubber, and similar elastomeric materials having suitable compressive and adhesive characteristics. Suitable materials for the conductive particles include silver and carbon in flake or dendritic form. Also, the conductive polymer material can comprise a conventional commercially available composition. Suitable conductive polymers are commercially available from various manufacturers including Shinetsu Chemical Co., Japan; EPI Technologies, Richardson Tex.; A. I. Technology, Trenton N.J.; and Sheldahl, Northfield, Minn.

In the active (closed) position of the test contactors 24 short electrical paths are provided between the terminal contacts 14 on the module 10 and the interface contacts 26 on the interface board 22. Because these electrical paths are relatively short, impedance, cross talk, and capacitive coupling are reduced. In addition to the short electrical paths, the test contactors 24 provide several advantages for applying test signals to the module 10. One advantage is that the tip portions 36 of the test contactors 24 penetrate the terminal contacts 14 as the test contactors 24 are moved by the actuator mechanism 34 into the closed position. This penetration helps to provide low resistance temporary electrical connections. Another advantage is that the tip portions 36 of the test contactors 24 exert spring forces for maintaining the electrical connections. The actuator mechanism 34 can also be configured to help exert and maintain these spring forces.

Still another advantage of the test contactors 24 is that temporary electrical connections can be made for testing, and then quickly disconnected following testing by the movement of the test contactors 24. A high throughput, and a low dwell time, can thus be provided for testing multiple modules 10 in a production environment. In addition, the test contactors 24 are relatively robust and are able to withstand abuse in a production environment. Still further, the test contactors 24 make the temporary electrical connections with the terminal contacts 14 without an insertion force being exerted on the module 10 (i.e., zero insertion force).

As shown in FIGS. 2A and 2C, in the illustrative embodiment, the test handler 30 is configured to support the module 10 and the interface board 22 in a parallel, edge to edge configuration. Specifically, the major planar surfaces of the module 10 and the interface board 22 are generally parallel to a common plane 38. In addition, an edge 40 of the module 10, and an edge 42 of the interface board 22, are aligned and proximate to one another. In the illustrative embodiment, the edges 40 and 42 are shown as being spaced by a small distance. Preferably this spacing distance is as small as possible, or can be entirely eliminated, to provide relatively short electrical paths (e.g., 0.25 inches or less) between the terminal contacts 14 and the interface contacts 26.

Also in the illustrative embodiment, some of the test contactors 24 are configured to electrically engage every other terminal contact 14 on a first side of the module 10, while others of the test contactors 24 are configured to electrically engage every other terminal contact 14 on an opposing second side of the module 10. Also, the test contactors 24 can be configured to electrically engage other types of terminal contacts than the flat planar terminal contacts 14 shown in the illustrative embodiments. For example, the test contactors can be configured to electrically engage bumped contacts (e.g., solder balls in a ball grid array), pin contacts (e.g., pins in a pin grid array), and various lead type contacts (e.g., gull wing leads, j-bend leads).

Referring to FIG. 2E, an alternate embodiment test system 20B is illustrated. The test system 20B is substantially similar in construction to the previously described test system 20. However, the test system 20B includes an interface board 22B having interface contacts 26B in the form of metal frets, or spring contacts, that are substantially similar in construction to the test contactors 24. In the alternate embodiment test system 20B, the interface contacts 26B take the place of the previously described conductive polymer interface contacts 26. As such, the interface contacts 26B are in electrical engagement with the high speed conductors 32, and are configured to electrically engage the test contactors 24.

Referring to FIGS. 3A and 3B, an alternate embodiment test system 20A is illustrated. The test system 20A is substantially similar in construction to the previously described test system 20. However, the test system 20B includes an interface board 22A having interface contacts 26A in the form of planar pads that are substantially similar in construction to the terminal contacts 14 on the module 10. In the alternate embodiment test system 20A, the interface contacts 26A take the place of the previously described conductive polymer interface contacts 26. As such, the interface contacts 26A are in electrical communication with high speed conductors 32A on the interface board 22A and external test circuitry 28A.

The test system 20A also includes test contactors 24A in the form of metal frets configured to simultaneously electrically engage the terminal contacts 14 on the component 10, and the interface contacts 26A on the interface board 22A. The test contactors 24A are physically attached to an actuator mechanism 34A of a test handler 30A. The actuator mechanism 34A is configured to move the test contactors 24A from the inactive (open) position of FIG. 3A, to the active (closed) position of FIG. 3B. In the active (closed) position of the test contactors 24A relatively short electrical paths are provided between the terminal contacts 14 on the module 10 and the interface contacts 26A on the interface board 22A. Because these electrical paths are relatively short, impedance, cross talk, and capacitive coupling are reduced.

The test contactors 24A have spring segment terminal portions configured to exert spring forces on the terminal contacts 14 and on the interface contacts 26A. In addition, the test contactors 24A are configured to exert clamping forces on either side of the module 10 and the interface board 22A. These features help the test contactors 24A to make reliable temporary electrical connections. Also the metal fret construction makes the test contactors 24A robust and able to withstand the rigors of a production environment.

As with the previous embodiment, the test handler 30A is configured to index the module 10 into position for testing, and then to move the module 10 out of the test handler 30A following testing. In addition, the test handler 30A is configured to support the module 10 and the interface board 22A generally parallel to a common plane 38A. Also, the module 10 and the interface board 22A are oriented edge to edge, with an edge 40A of the module 10 spaced from and generally parallel to an edge 42A of the interface board 22A.

Thus the invention provides a pass through test system and a pass through test method for electronic modules. Although the invention has been described with reference to certain preferred embodiments, as will be apparent to those skilled in the art, certain changes and modifications can be made without departing from the scope of the invention, as defined by the following claims.

I claim:

1. A system for testing an electronic module having a plurality of terminal contacts comprising:
   a test handler;
   a plurality of contactors on the test handler movable from an inactive position to an active position, the contactors comprising first spring segment terminal portions at one end configured in the inactive position to align with the terminal contacts and in the active position to electrically engage the terminal contacts, and second spring segment terminal portions at an opposing end; and
   a board on the test handler comprising a plurality contacts configured in the inactive position to align with the second spring segment portions and in the active position to electrically engage the second spring segment terminal portions.

2. The system of claim 1 wherein the contactors are configured to exert clamping forces on opposing sides of the module in the active position.

3. The system of claim 1 wherein the contactors comprise a metal and the first spring segment terminal portions are configured to penetrate the terminal contacts.

4. The system of claim 1 wherein the test handler comprises at least on actuator mechanism configured to control movement of the contactors.

5. The system of claim 1 further comprising a plurality of conductors on the board in electrical communication with the contacts and a test circuitry.

6. A system for testing an electronic module having a plurality of terminal contacts comprising:
   a test handler configured to support, move and index the module;
   a plurality of contactors on the test handler comprising first spring segment terminal portions on one end and second spring segment terminal portions on an opposing end, the contactors movable from an inactive position in which the first spring segment terminal portions are aligned with the terminal contacts, to an active position in which the first spring segment terminal portions electrically engage the terminal contacts;
   a board on the test handler comprising a plurality of contacts in electrical communication with a test circuitry, the contacts configured to align with the second spring segment terminal portions in the inactive position and to electrically engage the second spring segment terminal portions in the active position.

7. The system of claim 6 wherein the contactors are configured to exert clamping forces on opposing sides of the module in the active position.

8. The system of claim 6 wherein the module and the board have major surfaces and the test handler is configured to align the module and the board generally planar to a common plane.

9. The system of claim 6 wherein the first spring segment terminal portions are configured to penetrate the terminal contacts and the second spring segment terminal portions are configured to penetrate the contacts.

10. The system of claim 6 wherein the contacts comprise planar pads.

11. The system of claim 6 wherein in the active position the module and the board are oriented edge to edge generally parallel to a common plane.

12. A system for testing an electronic module having a plurality of terminal contacts comprising:
   a test handler configured to support, move and index the module;
   a board on the test handler comprising a plurality of contacts and a plurality of conductors in electrical communication with a test circuitry; and a plurality of contactors movably mounted to the test handler proximate to the board, the contactors comprising first spring segment terminal portions configured to electrically engage the terminal contacts and second spring segment terminal portions configured to electrically engage the contacts to establish electrical communication there between with a zero insertion force on the module.

13. The system of claim 12 wherein the first spring segment terminal portions are configured to penetrate the terminal contacts.

14. The system of claim 12 wherein the second spring segment terminal portions are configured to penetrate the contacts.

15. The system of claim 12 wherein the test handler is configured to support the board and the module edge to edge and generally parallel to a common plane.

16. The system of claim 12 wherein the module comprises an element selected from the group consisting of semiconductor memory modules, multi chip modules, semiconductor carriers, semiconductor packages, and microprocessors.

17. A system for testing an electronic module having a plurality of terminal contacts comprising:

a test handler configured to support, move and index the module;

a plurality of contactors on the test handler configured to move from an inactive position to an active position in which a clamping force is exerted on the module, the contactors comprising first terminal portions configured in the inactive position to align with the terminal contacts and in the active position to electrically engage the terminal contacts, and second terminal portions; and a board on the test handler comprising a plurality contacts in electrical communication with a test circuitry configured to align with the second terminal portions in the inactive position and to electrically engage the second terminal portions in the active position.

18. The system of claim 17 the board includes a plurality of conductors in electrical communication with the contacts.

19. The system of claim 18 wherein the contacts comprise planar pads.

20. The system of claim 19 wherein the test handler is configured to support the board and the module edge to edge and generally parallel to a common plane.

21. The system of claim 20 wherein the first terminal portions are configured to penetrate and exert spring forces on the terminal contacts and the second terminal portions are configured to penetrate and exert spring forces on the contacts.

22. In a pass through test system including a test circuitry for applying test signals to an electronic module having a terminal contact, a test system for establishing electrical communication between the test circuitry and the module comprising:

a board comprising a contact in electrical communication with the test circuitry; and a contactor proximate to the board and movable from an inactive position to an active position, the contactor comprising a first spring segment terminal portion configured in the inactive position to align with the terminal contact and in the active position to electrically engage the terminal contact, and a second spring segment terminal portion configured in the inactive position to align with the contact and in the active position to electrically engage the contact.

23. The contactor of claim 22 wherein the test system includes a plurality of contactors configured in the active position to exert clamping forces on the module.

24. The contactor of claim 22 wherein the first spring segment terminal portion is configured to penetrate the terminal contact and the second spring segment terminal portion is configured to penetrate the contact.

* * * * *

UNITED STATES PATENT AND TRADEMARK OFFICE
CERTIFICATE OF CORRECTION

PATENT NO. : 6,756,802 B2
DATED : June 29, 2004
INVENTOR(S) : Daniel P. Cram

It is certified that error appears in the above-identified patent and that said Letters Patent is hereby corrected as shown below:

<u>Column 8,</u>
Line 21, change "on" to -- one --.

<u>Column 10,</u>
Line 1, after "17" add -- wherein --.

Signed and Sealed this

Fourteenth Day of December, 2004

JON W. DUDAS
*Director of the United States Patent and Trademark Office*